(12) United States Patent
Teeter

(10) Patent No.: US 9,237,664 B2
(45) Date of Patent: Jan. 12, 2016

(54) MULTI-MODULE KEYING SYSTEM

(71) Applicant: Dell Products L.P., Round Rock, TX (US)

(72) Inventor: Victor B. Teeter, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 239 days.

(21) Appl. No.: 14/081,837

(22) Filed: Nov. 15, 2013

(65) Prior Publication Data

US 2015/0138724 A1   May 21, 2015

(51) Int. Cl.
*G06F 1/20* (2006.01)
*H05K 5/00* (2006.01)
*H05K 7/20* (2006.01)
*H01R 43/00* (2006.01)
*H01R 3/00* (2006.01)
*A47B 81/00* (2006.01)
*H05K 5/02* (2006.01)
*H05K 7/14* (2006.01)

(52) U.S. Cl.
CPC ............ *H05K 5/0208* (2013.01); *H05K 5/0221* (2013.01); *H05K 7/1408* (2013.01); *H05K 7/1489* (2013.01); *H05K 7/20736* (2013.01)

(58) Field of Classification Search
CPC . H05K 7/1408; H05K 7/1488; H05K 7/1489; H05K 7/20736; H05K 5/0208; H05K 5/0221; G06F 1/16; G06F 1/20
USPC .................. 361/732, 679.48, 679.58; 29/825; 292/102, 106, 251.5; 312/223.1, 223.2; 454/184; 439/488
See application file for complete search history.

(56) References Cited

U.S. PATENT DOCUMENTS

| 7,397,660 | B2* | 7/2008 | Strmiska | G06F 1/20 361/679.48 |
| 7,420,799 | B2* | 9/2008 | Wang | G06F 1/1616 292/102 |
| 7,609,514 | B2* | 10/2009 | Doczy | G06F 1/1616 312/223.1 |
| 2002/0008447 | A1* | 1/2002 | Tagawa | E05C 1/14 312/223.2 |
| 2008/0309098 | A1* | 12/2008 | Hsu | H04M 1/0245 292/251.5 |
| 2009/0158552 | A1* | 6/2009 | Guo | G06F 1/1616 16/65 |
| 2010/0142143 | A1* | 6/2010 | Ong | G06F 1/20 361/679.48 |

* cited by examiner

Primary Examiner — Courtney Smith
Assistant Examiner — Zhengfu Feng
(74) Attorney, Agent, or Firm — Haynes and Boone, LLP

(57) ABSTRACT

Multi-module keying systems and methods include a chassis. A first module slot and a second module slot are located on the chassis. A keying device is movably coupled to the chassis and includes a first keying member that is located adjacent the first module slot and a second keying member that is located adjacent the second module slot. The keying device is configured to move in response to a first keyed module being positioned in the first module slot such that the first keyed module engages the first keying member. The movement of the keying device positions the second keying member adjacent the second module slot to restrict modules that may be positioned in the second module slot to second keyed modules. The systems and methods allow the second module slot to be keyed for second keyed modules based on the first keyed module positioned in the first module slot.

14 Claims, 14 Drawing Sheets

MULTI-MODULE KEYING SYSTEM

BACKGROUND

The present disclosure relates generally to information handling systems, and more particularly to a keying system for information handling systems that are configured to couple to multiple different modules.

As the value and use of information continues to increase, individuals and businesses seek additional ways to process and store information. One option is an information handling system (IHS). An IHS generally processes, compiles, stores, and/or communicates information or data for business, personal, or other purposes. Because technology and information handling needs and requirements may vary between different applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, or global communications. In addition, IHSs may include a variety of hardware and software components that may be configured to process, store, and communicate information and may include one or more computer systems, data storage systems, and networking systems.

Some IHSs are configured to couple to multiple different modules to enable different functionality of the IHS. For example, some switch IHSs may be mounted to either the front or back of an IHS rack, and the switch IHSs cooling system may be configurable to adjust the airflow direction in the switch IHS so that air is drawn from a "cool" side of the IHS rack (e.g., the side of the IHS rack to which other IHSs in the IHS rack do not expel heated air) and expelled out of a "hot" side of the IHS rack (e.g., the side of the IHS rack to which other IHSs in the IHS rack expel heated air). To enable this configurability, the switch IHS may include fan module slots that allow for the coupling of different type fan modules: a first type of fan module that provides airflow in a first direction, and a second type of fan module that provides airflow in a second direction. However, problems can arise when different types of fan modules are coupled to the switch IHS in the fan module slots at the same time. For example, if a user couples fan module(s) of the first type in one or more first fan module slots in the switch IHS, and fan module(s) of the second type in one or more second fan module slots in the switch IHS, those different type fan modules will provide airflow in different directions and prevent cooling air from properly cooling the switch IHS components (e.g., the first type fan module(s) will draw air into the switch IHS from a first side of the IHS rack, and the second type fan modules will expel that air out of the switch IHS and back to the first side of the IHS rack before it reaches the switch IHS components.)

Accordingly, it would be desirable to provide an improved multi-module coupling system.

SUMMARY

According to one embodiment, an information handling system (IHS) includes an IHS chassis that houses a processing system and a memory system coupled to the processing system; a first IHS component slot that is located on the IHS chassis; a second IHS component slot that is located on the IHS chassis; a keying device that is movably coupled to the IHS chassis and that includes a first keying member that is located adjacent the first IHS component slot and a second keying member that is located adjacent the second IHS component slot, wherein the keying device is configured to move in response to a first keyed IHS component being positioned in the first IHS component slot such that the first keyed IHS component engages the first keying member, and wherein the movement of the keying device positions the second keying member adjacent the second IHS component slot to restrict IHS components that may be positioned in the second IHS component slot to second keyed IHS components.

DETAILED DESCRIPTION

For purposes of this disclosure, an IHS may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an IHS may be a personal computer, a PDA, a consumer electronic device, a display device or monitor, a network server or storage device, a switch router or other network communication device, or any other suitable device and may vary in size, shape, performance, functionality, and price. The IHS may include memory, one or more processing resources such as a central processing unit (CPU) or hardware or software control logic. Additional components of the IHS may include one or more storage devices, one or more communications ports for communicating with external devices as well as various input and output (I/O) devices, such as a keyboard, a mouse, and a video display. The IHS may also include one or more buses operable to transmit communications between the various hardware components.

Figure 1:
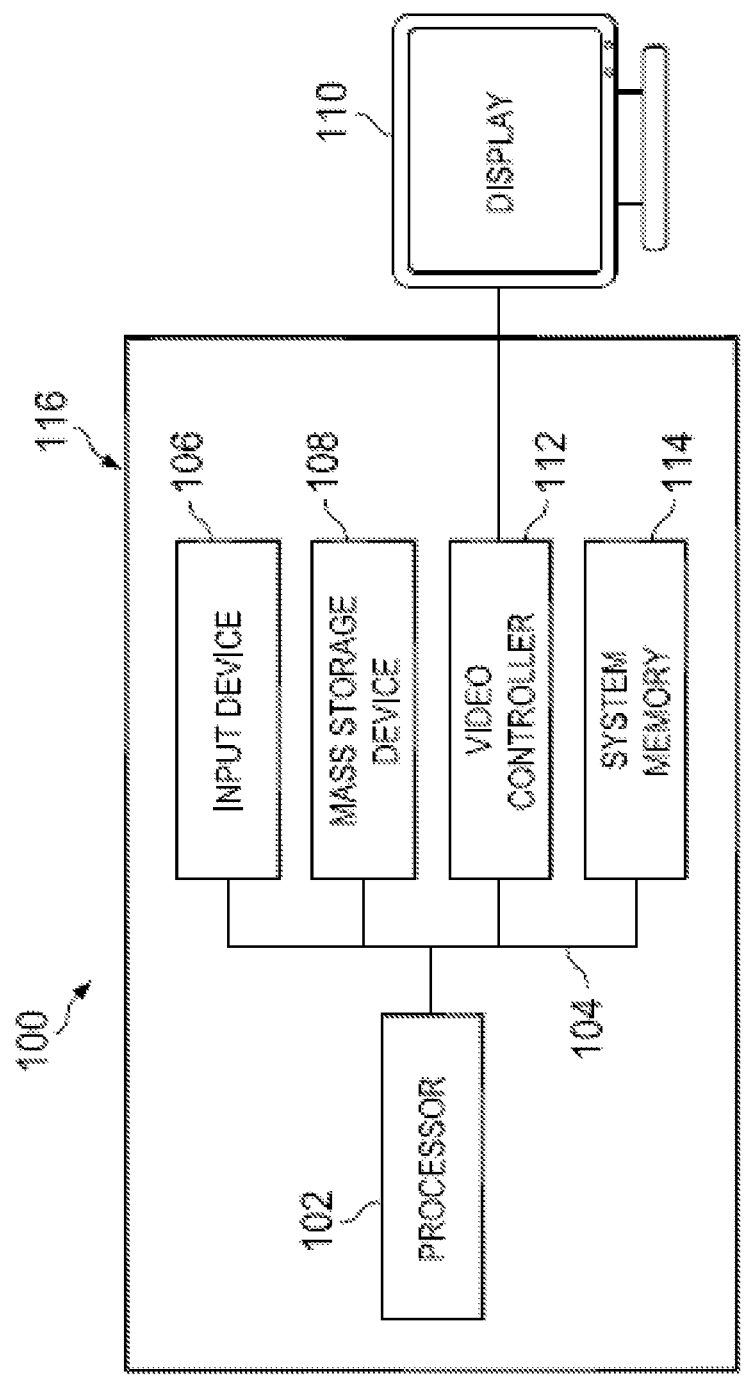
FIG. 1 is a schematic view illustrating an embodiment of an information handling system.

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Figure 2A:
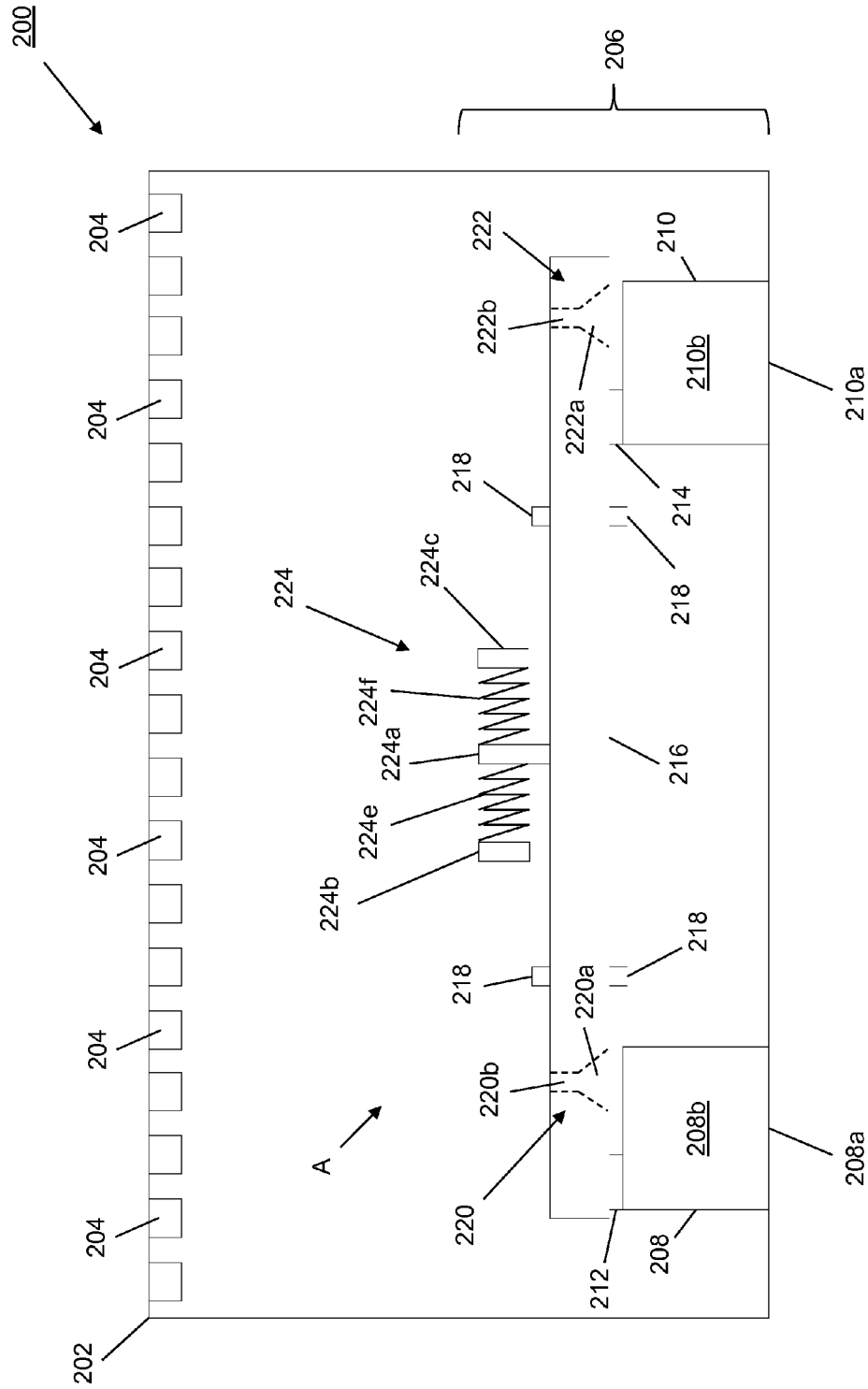
FIG. 2a is a schematic view illustrating an embodiment of an IHS component keying system.

Referring now to FIG. 2a, an embodiment of an IHS 200 is illustrated. The IHS 200 may be the IHS 100, discussed above with reference to FIG. 1, and/or may include any or all of the components of the IHS 100. In the embodiments discussed below, the IHS 200 is a switch IHS that is provided with multiple different fan modules for providing a desired airflow through the switch IHS chassis. However, the IHS 200 may be other IHSs known in the art and may be provided with a wide variety of different IHS components including, for example, power supply modules that operate at different power levels, mirrored disk drive modules, memory devices, and/or other IHS components known in the art. The IHS 200 includes an IHS chassis 202 that may include a variety of IHS components 204. In the illustrated embodiment, the IHS chassis 202 is a switch IHS chassis and the IHS components 204 are switch ports that may be coupled to other IHS components (not illustrated) in the switch IHS chassis such as a processing system (e.g., the processor 102 discussed above with reference to FIG. 1), a memory system (e.g., the storage device 108 and/or system memory 114 discussed above with reference to FIG. 1), and/or a wide variety of other switch IHS components known in the art.

The IHS 200 includes a multi-module keying system 206 that includes a plurality of module slots 208 and 210 that, in the illustrated embodiment, are IHS components slots defined by the IHS chassis 202 that include slot entrances 208a and 210a, respectively, that are configured to accept modules/IHS components for coupling those modules/IHS components to the IHS chassis 202 and IHS components housed in the IHS chassis 202. As such, the module slots 208 and 210 may include features (not illustrated) for routing, securing, and/or otherwise allowing the modules/IHS components to move through the module slots 208 and 210 and couple to the IHS chassis 202. Module connectors 212 and 214 are positioned adjacent the module slots 208 and 210, respectively, and in the illustrated embodiment include IHS component connectors that are coupled to IHS components (e.g., the processing system discussed above) in the IHS chassis 202.

A keying device 216 is moveably coupled to the IHS chassis 202 by a plurality of guide members 218 and, in the illustrated embodiment, includes an elongated beam that is located adjacent both the module slot 208 and the module slot 210. While not illustrated specifically, the guide members 218 may be any moveable coupling that allows the keying device 216 to move relative to the IHS chassis 202 (e.g., the translational movement discussed below). The keying device 216 includes a first keying member 220 that is located adjacent the module slot 208, and a second keying member 222 that is located adjacent the module slot 210, as illustrated in FIG. 2a. In the embodiments discussed below, the first keying member 220 and the second keying member 222 are defined by the keying device 216 and each include a beveled "pin-capturing" portion 220a and 222a, respectively, and a pin channel 220b and 222b, respectively. However, one of skill in the art in the possession of the present disclosure will recognize that a wide variety of structures may be used for the keying members to provide the functionality discussed below for the multi-module keying system 206 while remaining within the scope of the present disclosure. In the illustrated embodiment, the multi-module keying system 206 includes a biasing system 224 that includes a beam 224a extending from the keying device 216, a pair of spaced apart walls 224b and 224c that are coupled to the IHS chassis 202 on either side of the beam 224a, a spring member 224e extending between the wall 224b and beam 224a, and a spring member 224f extending between the wall 224c and bean 224a. While a specific embodiment of the biasing system 224 has been provided, one of skill in the art in possession of the present disclosure will recognize that the keying device 216 may be biased in a wide variety of manners to provide the functionality discussed below while remaining within the scope of the present disclosure. Furthermore, as discussed below, in some embodiments the keying device 216 may not be biased, but instead may be manually actuated by a user. In the illustrated embodiment, with no external forces provided, the biasing system 224 biases the keying device 216 into a neutral orientation A.

Figure 2B:
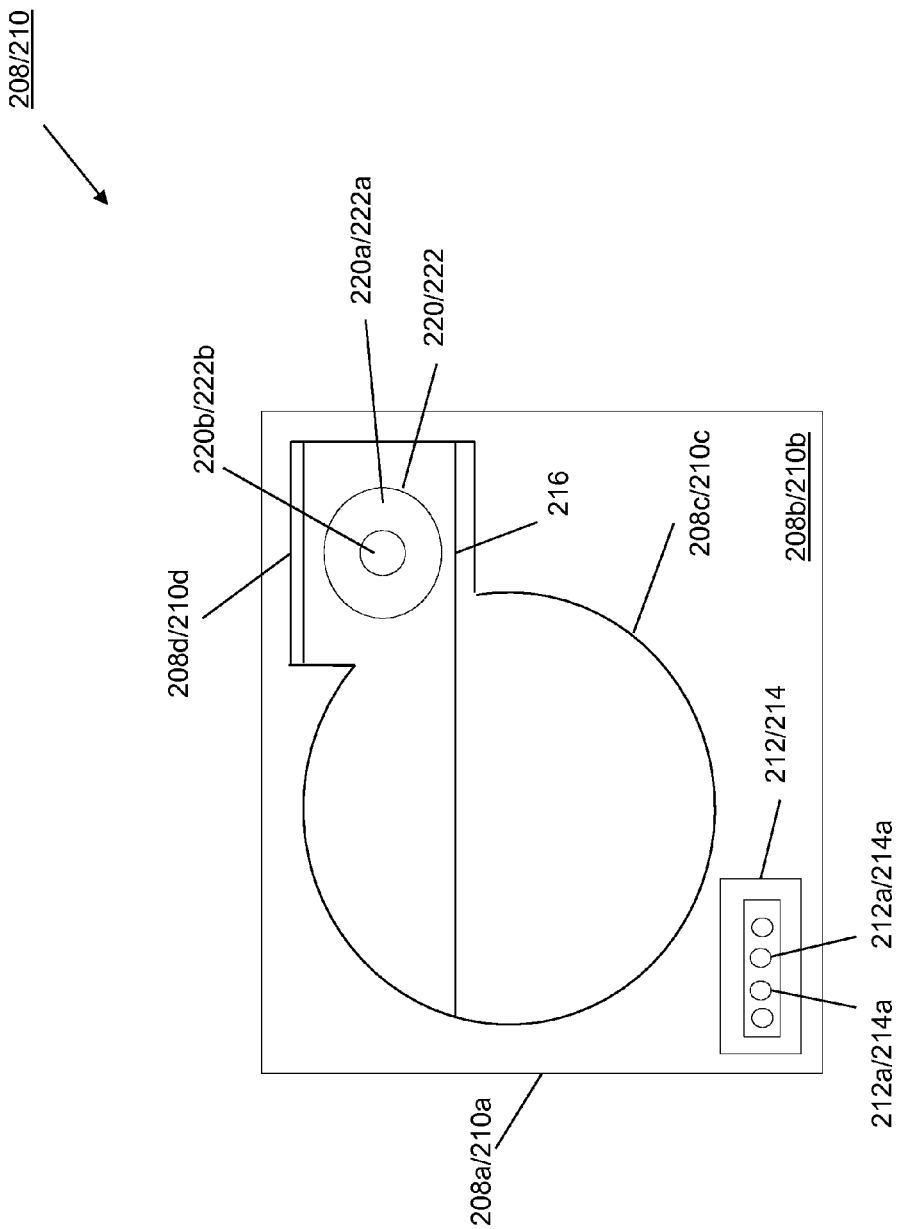
FIG. 2b is a schematic view illustrating an embodiment of an IHS component slot in the IHS component keying system of FIG. 2.

Referring now to FIG. 2b, an embodiment of the module slots 208/210 is illustrated. The module slot 208/210 includes the slot entrance 208a/210a that provides access to a module slot housing 208b/210b. The module connector 212/214 is positioned at the rear of the module slot housing 208b/210b (opposite the module slot housing 208b/210b from the slot entrance 208a/210a) in a lower left corner (as viewed in FIG. 2b) of the module slot housing 208b/210b, and includes a plurality of pin connections 212a/214a. In the illustrated embodiment, the module slot 208/210 is configured for a fan module and includes an airflow channel 208c/210c positioned at the rear of the module slot housing 208b/210b (opposite the module slot housing 208b/210b from the slot entrance 208a/210a). A keying device access channel 208d/210d is positioned at the rear of the module slot housing 208b/210b (opposite the module slot housing 208b/210b from the slot entrance 208a/210a) in an upper right corner (as viewed in FIG. 2b) of the module slot housing 208b/210b and opposite the airflow channel 208c/210c from the module connector 212/214. In the embodiment illustrated in FIG. 2b, the keying device 216 is in the neutral orientation A such that the first keying member 220 on the keying device 216 is positioned adjacent the keying device access channel 208c and the second keying member 222 on the keying device 216 is positioned adjacent the keying device access channel 210c. While in the illustrated embodiment a portion of the keying device 216 is shown blocking a portion of the airflow channel 208c/210c, that embodiment is provided to clearly illustrate the functionality of the multi-module keying system 200, and one of skill in the art in possession of the present disclosure will recognize that the keying device 216, the airflow channel 208c/210c, and/or the fan modules, may be structured to prevent any inefficiencies in airflow through the IHS chassis 202. While not illustrated, as discussed above the module slot 208/210 may include features (not illustrated) for routing, securing, and/or otherwise allowing the modules/IHS components to move through the module slot 208/210 and couple to the IHS chassis 202.

Figure 3:
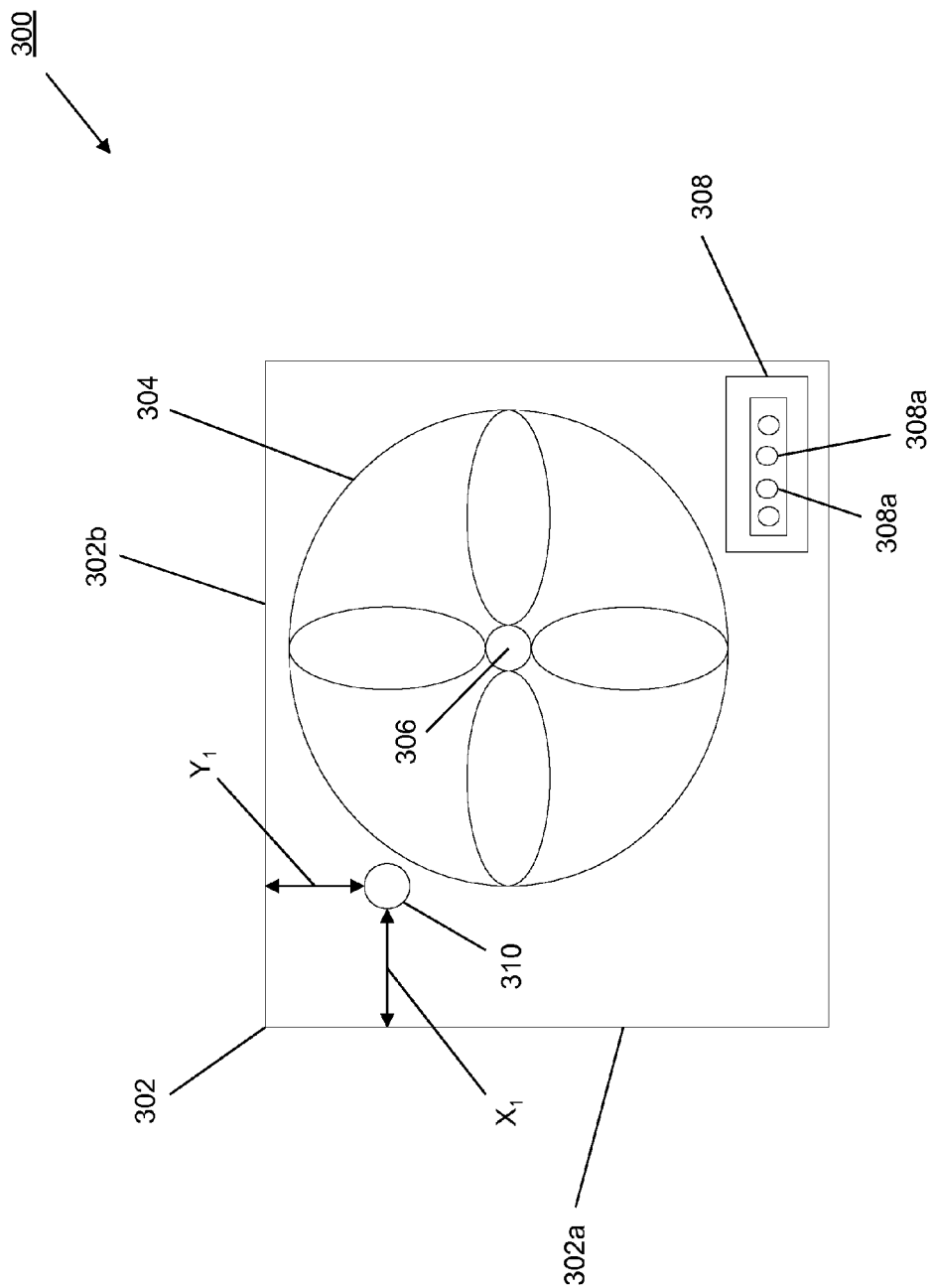
FIG. 3 is a schematic view illustrating an embodiment of a keyed IHS component used with the IHS component keying system of FIG. 2.

Referring now to FIG. 3, an embodiment of a keyed module 300 is illustrated. In the embodiments discussed below, the keyed module 300 is a keyed IHS component 300 and, specifically, a first airflow direction type fan module that is configured to operate to provide airflow in a first airflow direction when coupled to one of the module slots 208 or 210 (e.g., by drawing air from the front of the IHS chassis 202 and expelling that air out of the rear of the IHS chassis 202). However, as discussed above, the multi-module keying system 200 may be provided for wide variety of different IHS components including, for example, power supply modules that operate at different power levels, mirrored disk drive modules, memory devices, and/or other IHS components known in the art. The keyed IHS component 300 includes a component chassis 302 defining an airflow channel 304 that houses a fan 306. The details of the fan system provided by the keyed IHS component 300 are well known in the art and will not be discussed here. The component chassis 302 also includes a connector 308 having a plurality of pins 308a. A keyed member 310 is included on the component chassis 302 adjacent the airflow channel 304 and, in the illustrated embodiment, includes a pin member that extends from the component chassis 302. As can be seen, the keyed member 310 is positioned on the component chassis 302 such that it is located a distance $X_1$ from a side surface 302a on the component chassis 302 and a distance $Y_1$ from a top surface 302b on the component chassis 302.

Figure 4:
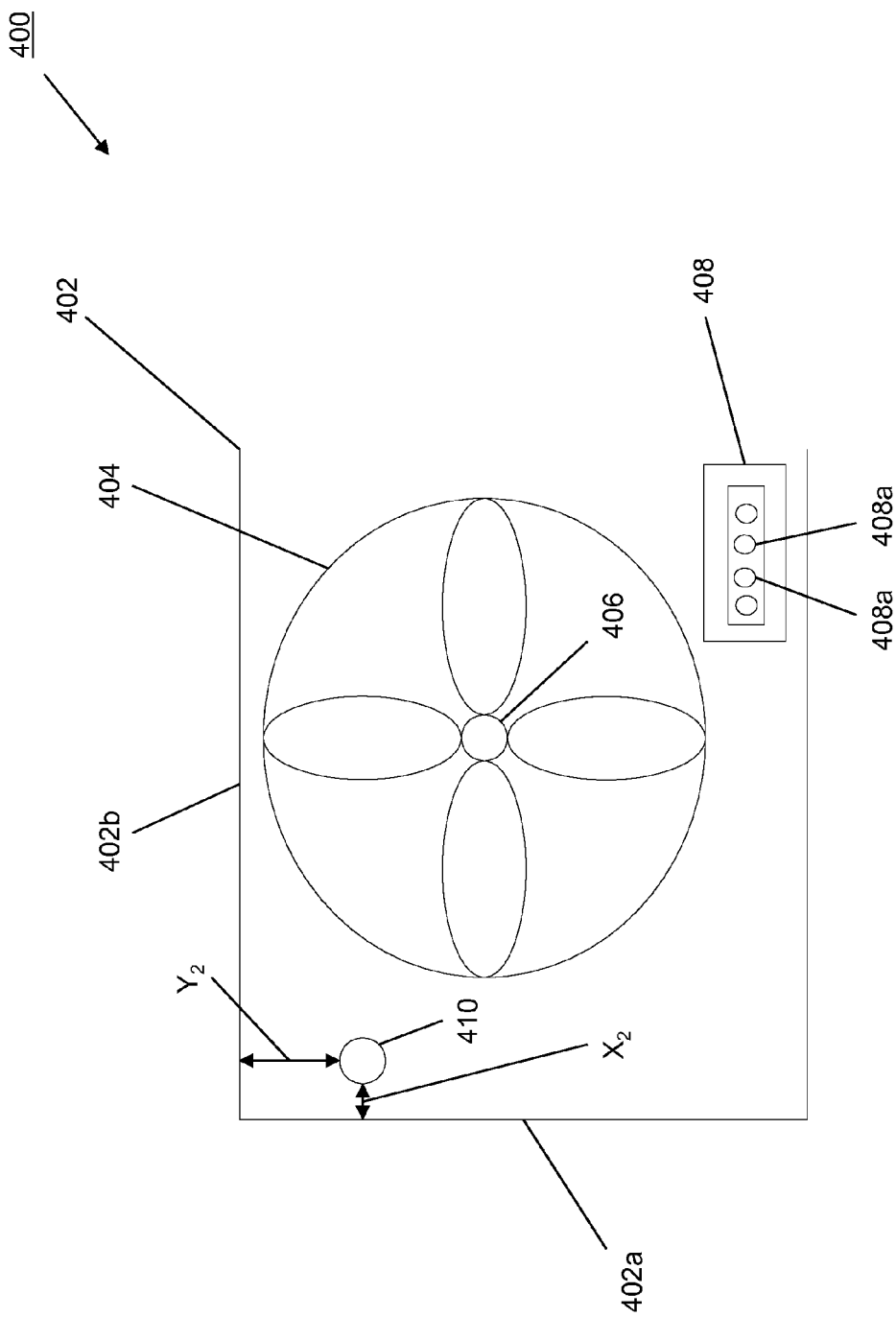
FIG. 4 is a schematic view illustrating an embodiment of a keyed IHS component used with the IHS component keying system of FIG. 2.

Referring now to FIG. 4, an embodiment of a keyed module 400 is illustrated. In the embodiments discussed below, the keyed module 400 is a keyed IHS component 400 and, specifically, a second airflow direction type fan module that is configured to operate to provide airflow in a second airflow direction when coupled to one of the module slots 208 or 210 that is different than the first airflow direction discussed above in FIG. 3 (e.g., by drawing air from the rear of the IHS chassis 202 and expelling that air out to the front of the IHS chassis 202). However, as discussed above, the multi-module keying system 200 may be provided for wide variety of different IHS components including, for example, power supply modules that operate at different power levels, mirrored disk drive modules, memory devices, and/or other IHS components known in the art. The keyed IHS component 400 includes a component chassis 402 defining an airflow channel 404 that houses a fan 406. The details of the fan system provided by the keyed IHS component 400 are well known in the art and will not be discussed here. The component chassis 402 also includes a connector 408 having a plurality of pins 408a. A keyed member 410 is included on the component chassis 402 adjacent the airflow channel 404 and, in the illustrated embodiment, includes a pin member that extends from the component chassis 402.

As can be seen, the keyed member 410 is positioned on the component chassis 402 such that it is located a distance $X_2$ from a side surface 402a on the component chassis 402 and a distance $Y_2$ from a top surface 402b on the component chassis 402. As discussed in further detail below, at least one of the distances $X_2$ and $Y_2$ for the keyed module 400 is different from the distances $X_1$ and $Y_1$ for the keyed module 300 such that the keyed members 310 and 410 are located at different positions relative to the component chassis 302 and 402, respectively. In the embodiments illustrated in FIGS. 3 and 4, the distance $X_2$ is smaller than $X_1$ (with $Y_1$ and $Y_2$ being the same) such that the keyed member 410 is located on the component chassis 302 relatively closer to the side surface 402a than the keyed member 310 is located on the component chassis 302 to the side surface 302a. The positioning of the keyed members 310 and 410 may be selected, along with the keying device 216 (and specifically, the first keying member 220 and second keying member 222 discussed above with reference to FIG. 2) to define what types of second keyed modules may be coupled to the IHS chassis 202 following the coupling of a first keyed module to the IHS chassis 202, discussed in further detail below. As such, one of skill in the art in possession of the present disclosure will recognize that a wide variety of different types of keyed members 310 and 410, different positioning of keyed members 310 and 410, and/or other details of the keyed members 310 and 410 may be selected to provide the functionality discussed below while remaining within the scope of the present disclosure.

Figure 5:
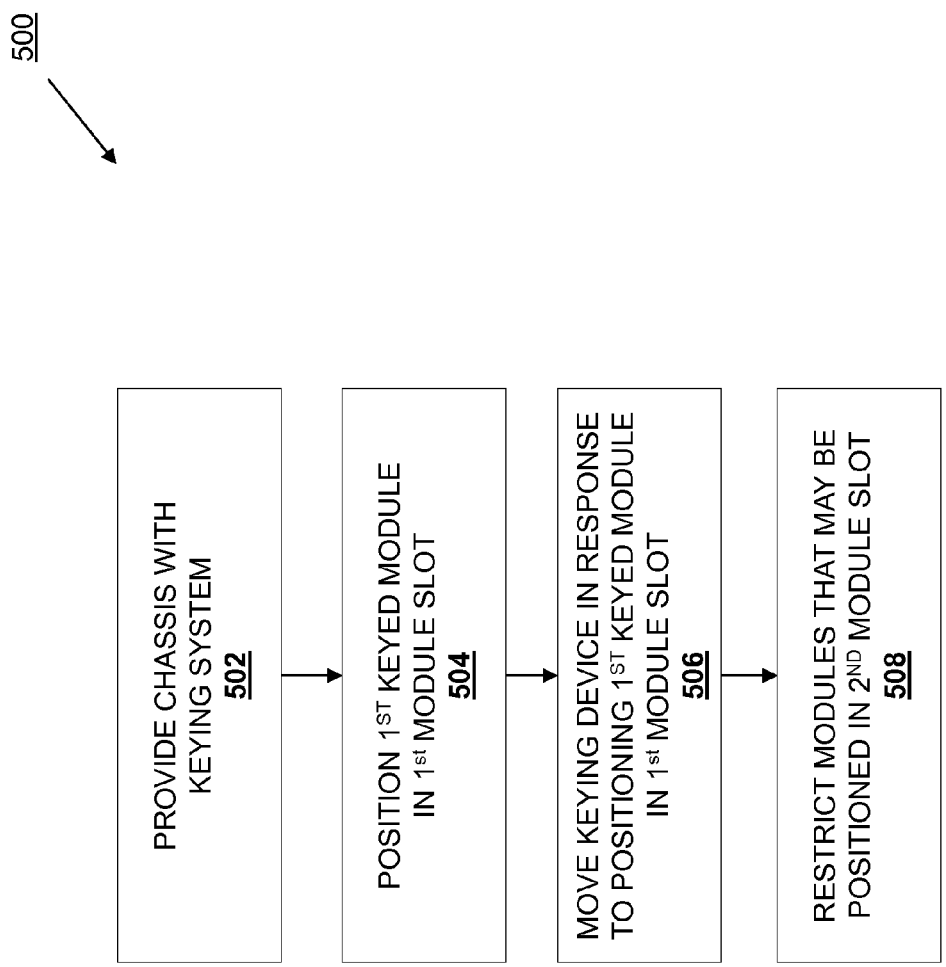
FIG. 5 is a flow chart illustrating an embodiment of a method for coupling IHS components to an IHS chassis.
Figure 6A:
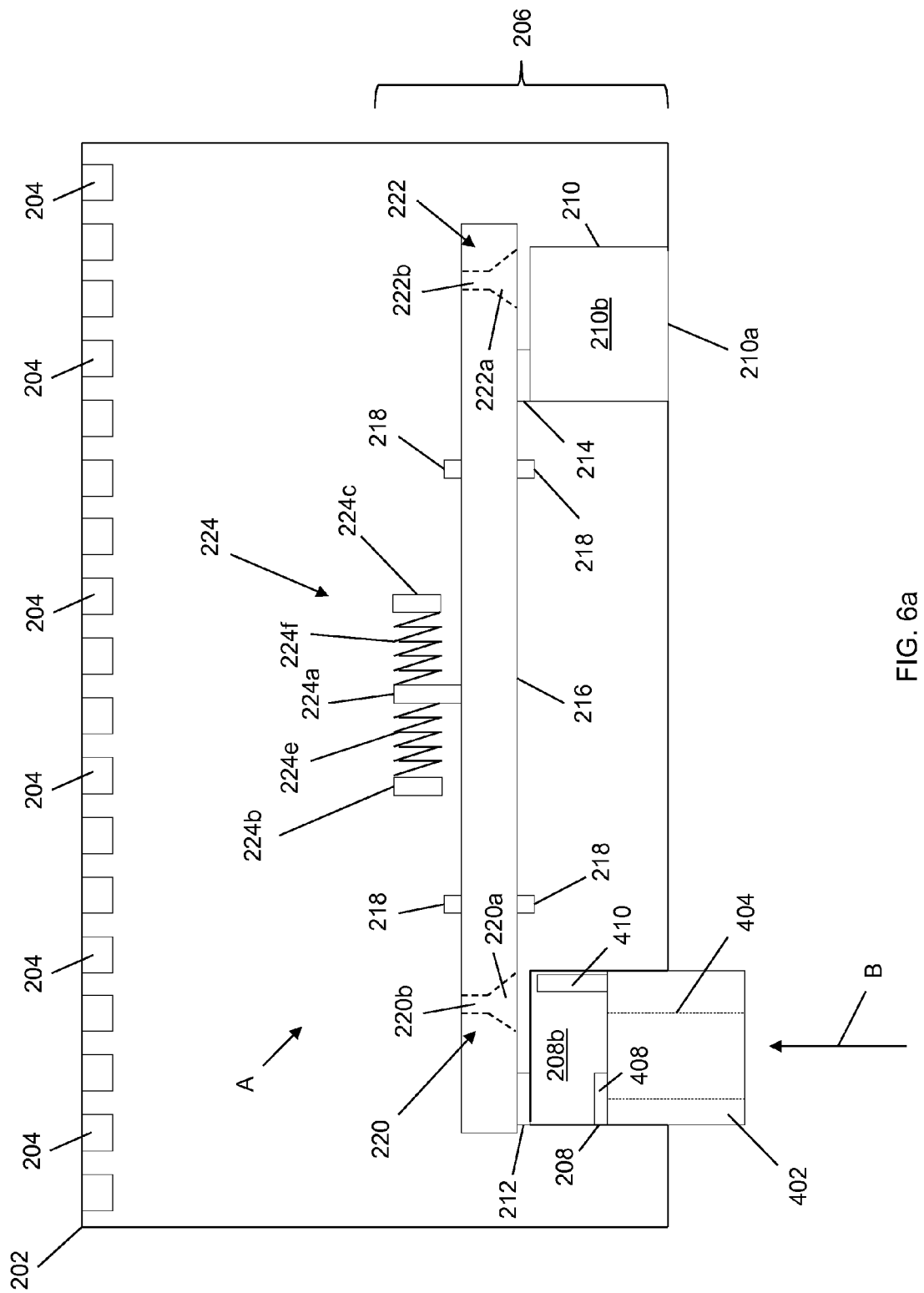
FIG. 6a is a schematic view illustrating an embodiment of a keyed component being coupled to the IHS component keying system of FIG. 2.

Referring now to FIG. 5, an embodiment of a method 500 for coupling modules to a chassis is illustrated. The method 500 begins at block 502 where a chassis with a keying system is provided. In an embodiment, the IHS 200 having the IHS chassis 202 with the keying system 206, illustrated in FIGS. 2a and 2b, is provided. The method 500 then proceeds to block 504 where a first keyed module is positioned in a first module slot. Referring to FIGS. 2a, 2b, 4, 6a, and 6b, in the illustrated embodiment of block 504, the first keyed module is the keyed module 400 discussed above with reference to FIG. 4. For example, a user may wish to configure the IHS chassis 202 and its cooling system such that an airflow produced by fan modules in the module slots 208 and 210 is drawn from the rear of the IHS chassis 202 (adjacent the module slots 208 and 210) and expelled out to the front of the IHS chassis 202 (adjacent the ports 204). To do so, the user must position a second airflow direction type fan module 400 in each of the module slots 208 and 210. In order to position the keyed module 400 in the module slot 208, the user positions the keyed module 400 adjacent the slot entrance 208a of the module slot 208 such that the keyed member 410 and module connector 408 are positioned adjacent the slot entrance 208a, and then moves the keyed module 400 in a direction B such that the keyed module 400 enters the module slot housing 208b, as illustrated in FIG. 6a. Continued movement of the keyed module 400 in the direction B will move the component chassis 402 through the module slot housing 208b of the module slot 208.

Figure 6B:
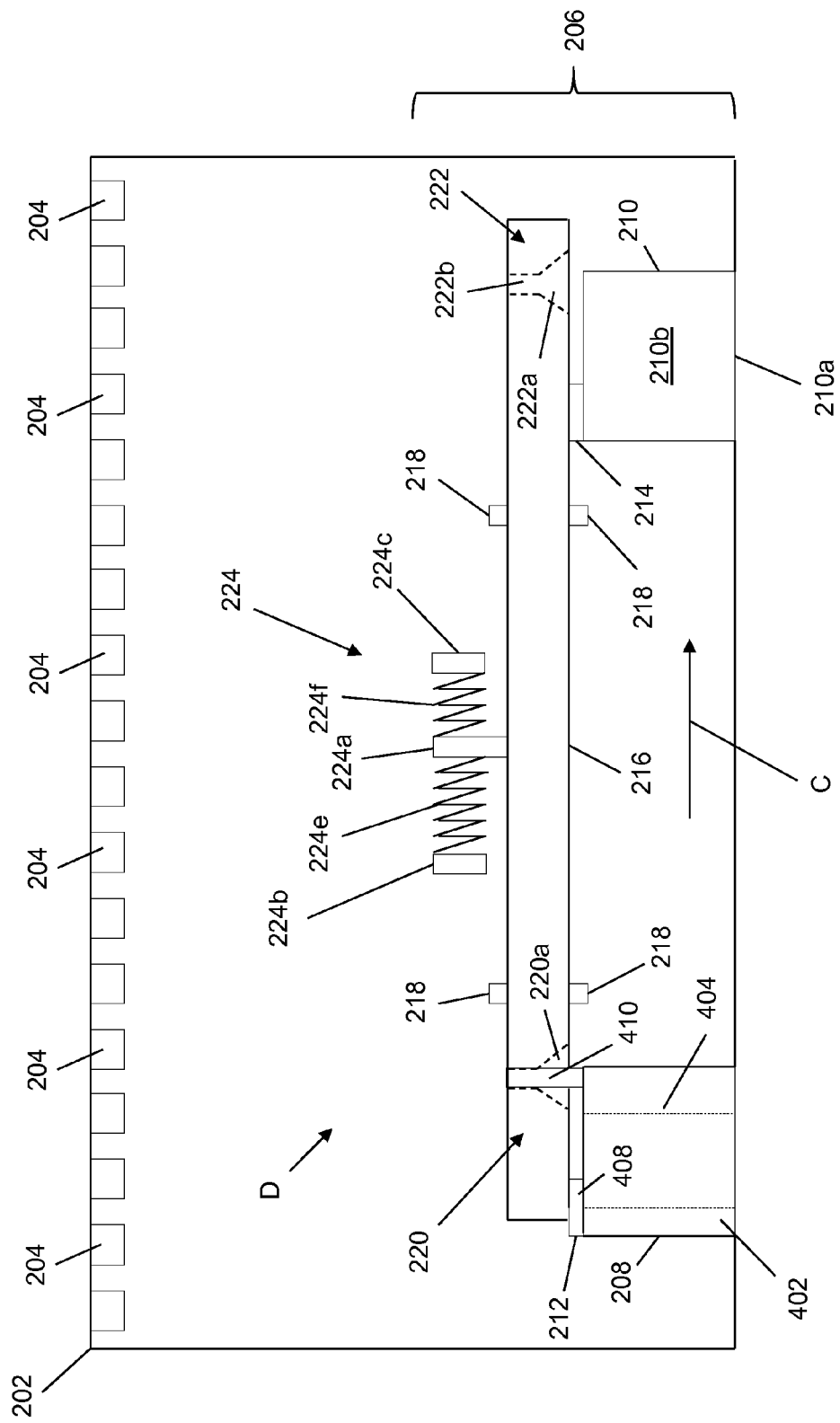
FIG. 6b is a schematic view illustrating an embodiment of a keyed component coupled to the IHS component keying system of FIG. 2.

The method 500 then proceeds to block 506 where the keying device is moved in response to positioning the first keyed module in the first module slot. During method blocks 504 and 506 (which may occur at the same time), as the keyed module 400 is moved in the direction B to position the keyed module 400 in the module slot 208, the keyed member 410 on the keyed module 400 engages the first keying member 220 on the keying device 216. In the illustrated embodiment, with the keying device 216 in the neutral orientation A, the first keying member 220 is offset from the position of the keyed member 410 as the keyed module 400 moves through the module slot housing 208b such that the pin channel 220b on the first keying member 220 is not aligned with the keyed member 410. As such, continued movement of the keyed module 400 in the direction B during blocks 504 and 506 causes the keyed member 410 to engage the pin capturing portion 220a of the first keying member 220. Engagement of the keyed member 410 with the pin capturing portion 220a of the first keying member 220 provides a force on the keying device 216 that opposes the biasing force provided by the biasing system 224 and causes the keying device 216 to move in a direction C until the pin channel 220b on the first keying member 220 aligns with the keyed member 410 such that the keyed member 410 may enter the pin channel 220b, as illustrated in FIG. 6b. With the keyed member 410 located in the pin channel 220b, the keying device 216 has moved from the neutral orientation A to a first keyed orientation D (i.e., an orientation based on its engagement with the first keyed device (the keyed module 400 in the illustrated embodiment)). Fully positioning the keyed member 410 in the module slot 208 results in the mating of the module connector 408 on the keyed module 400 with the module connector 212 in the IHS chassis 202.

The movement of the keying device 216 in the direction C and into the first keyed orientation D, resulting from the engagement of the keyed member 410 on the keyed module 400 and the first keying member 220, adjusts the position of the second keying member 222 relative to the module slot 210. In the embodiments discussed below, the first keying member 220 and the second keying member 222 are configured on the keying device 216 to ensure that only the same types of keyed modules may be positioned in the module slots 208 and 210. For example, as discussed above, several issues can arise if different fan modules that produce different direction airflows are both coupled to module slots in an IHS chassis, and thus the keying device 216 may be configured so that only similar type (e.g., similar airflow direction) fan modules (e.g., keyed with keyed members in a particular location on the fan module chassis) may be positioned in the module slots 208 and 210 at the same time. As such, in the illustrated embodiment, the first keying member 220 and the second keying member 222 are configured on the keying device 216 such that when the keyed module 400 is positioned in the module slot 208 to move the keying device 216 to the first keyed orientation D, the second keying member 222 is repositioned adjacent the module slot 210 such that only another keyed module 400 may be positioned in the module slot 210. However, in other embodiments, the keying device 216 may be configured such that only different type modules may be positioned in the module slots 208 and 210 (e.g., by adjusting the relative position of the second keying member 222 on the keying device 216.) One of skill in the art in possession of the present disclosure will recognize that the relative positioning of the first keying member 220, the second keying member 222, and any other keying members may be selected to restrict the position of other keyed modules into module slots based on the positioning of a first keyed modules in a first module slot.

Figure 6C:
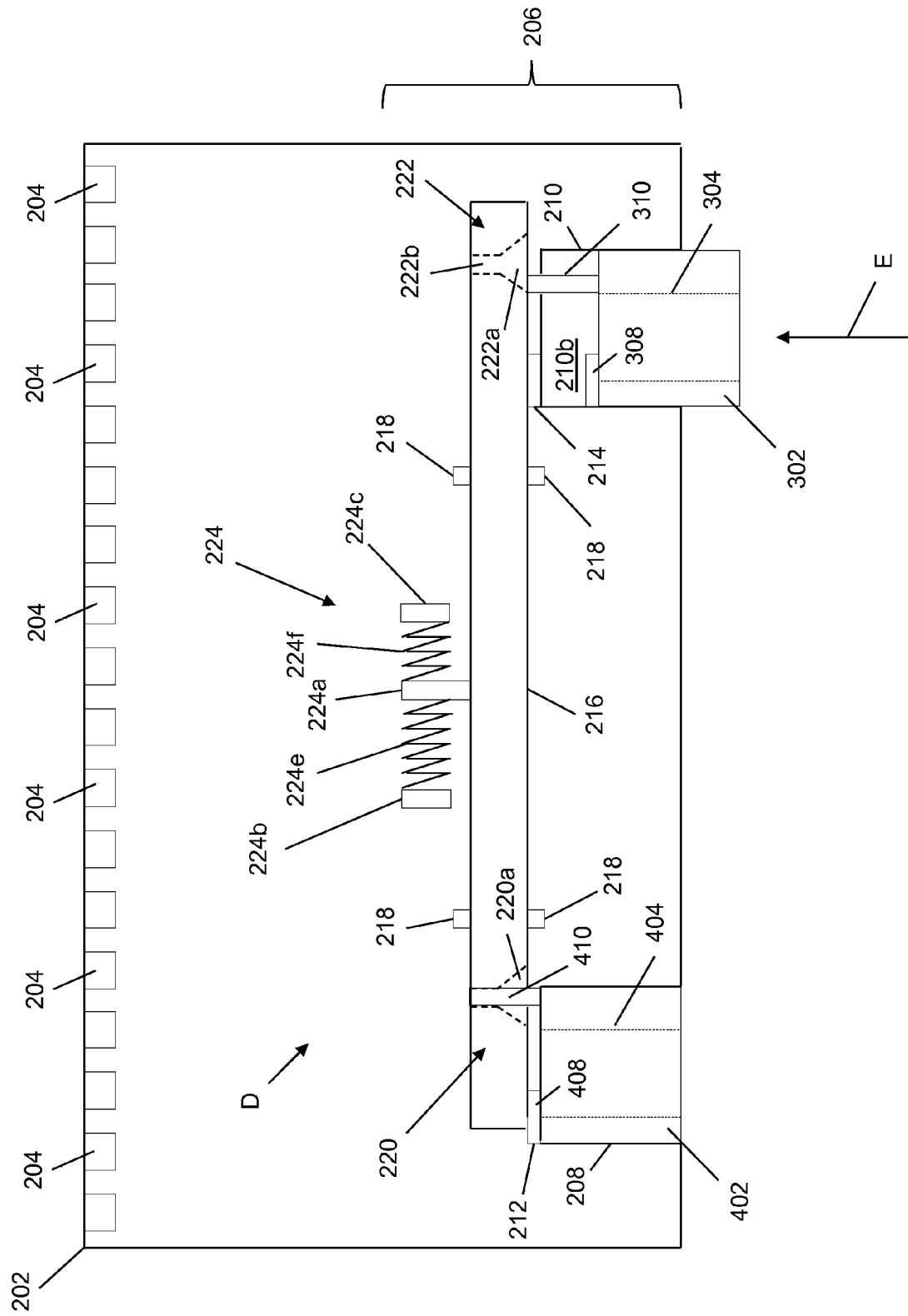
FIG. 6c is a schematic view illustrating an embodiment of an incorrectly keyed component attempting to be coupled to the IHS component keying system of FIG. 2.

The method 500 then proceeds to block 508 where modules that may be positioned in a second module slot are restricted. As discussed above, the keying device 216 may be configured such that only the same types of modules may be positioned in the module slots 208 and 210. Referring to FIG. 6c, the user may attempt to position a first airflow direction type fan module (the keyed module 300) in the module slot 210 at block 508 by positioning the keyed module 300 adjacent the slot entrance 210a of the module slot 210 such that the keyed member 310 and module connector 308 are positioned adjacent the slot entrance 208a, and then moving the keyed module 300 in a direction E such that the keyed module 300 enters the module slot housing 308b. However, as illustrated in FIG. 6c, continued movement of the keyed module 300 in the direction E causes the keyed member 310 to engage the keying device 216/second keying member 222, and because the keying device 216 is held in the first keyed orientation D by the positioning of the keyed member 410 in the pin channel 220b, the keying device 216 cannot move and the keyed module 300 is prevented from being positioned fully in the module slot 210. One of skill in the art will recognize that any keyed module that does not include a properly positioned keyed member will be prevented from being fully positioned in the module slot 210 in the same manner.

Figure 6D:
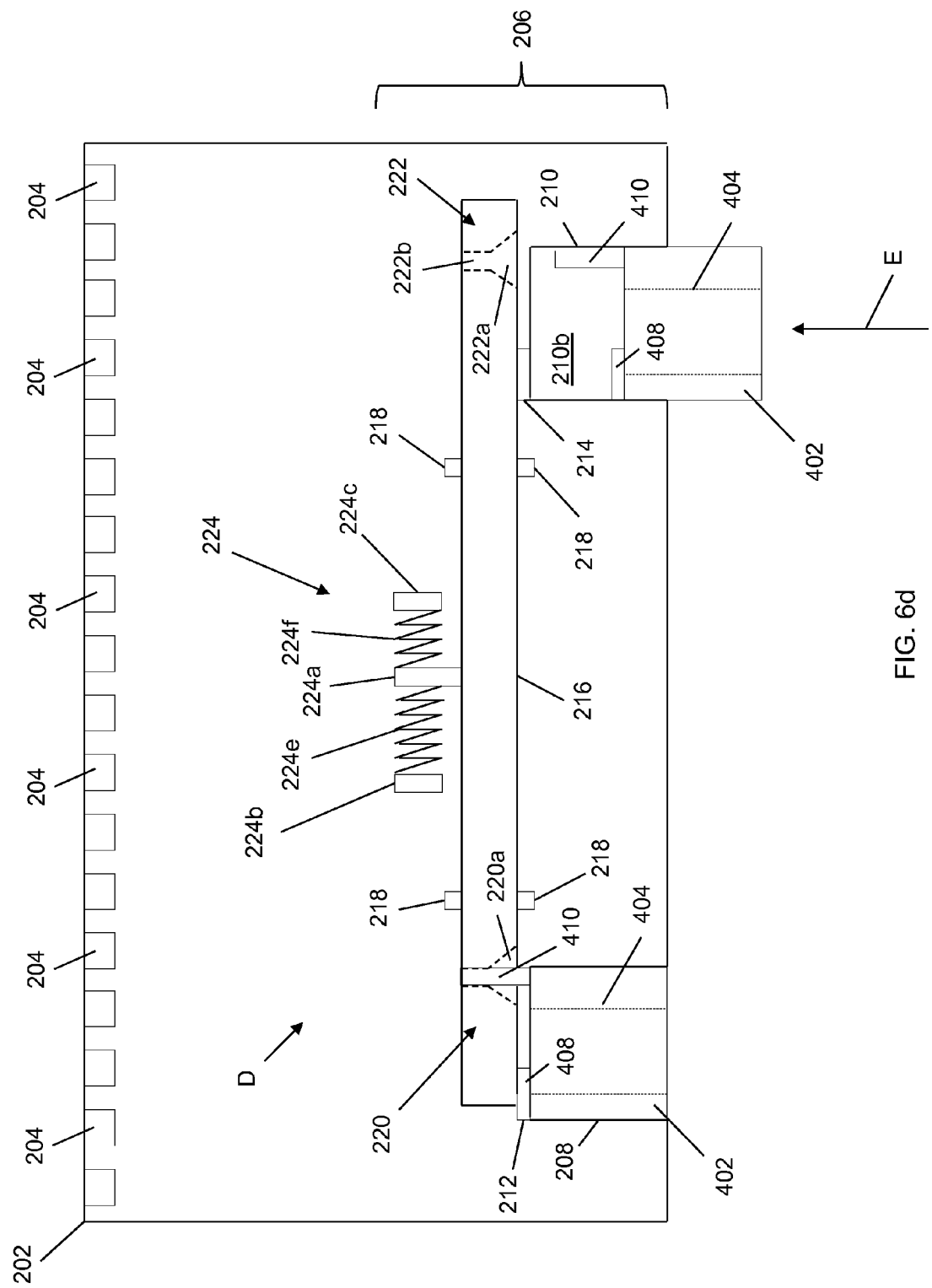
FIG. 6d is a schematic view illustrating an embodiment of a correctly keyed component being coupled to the IHS component keying system of FIG. 2.
Figure 6E:
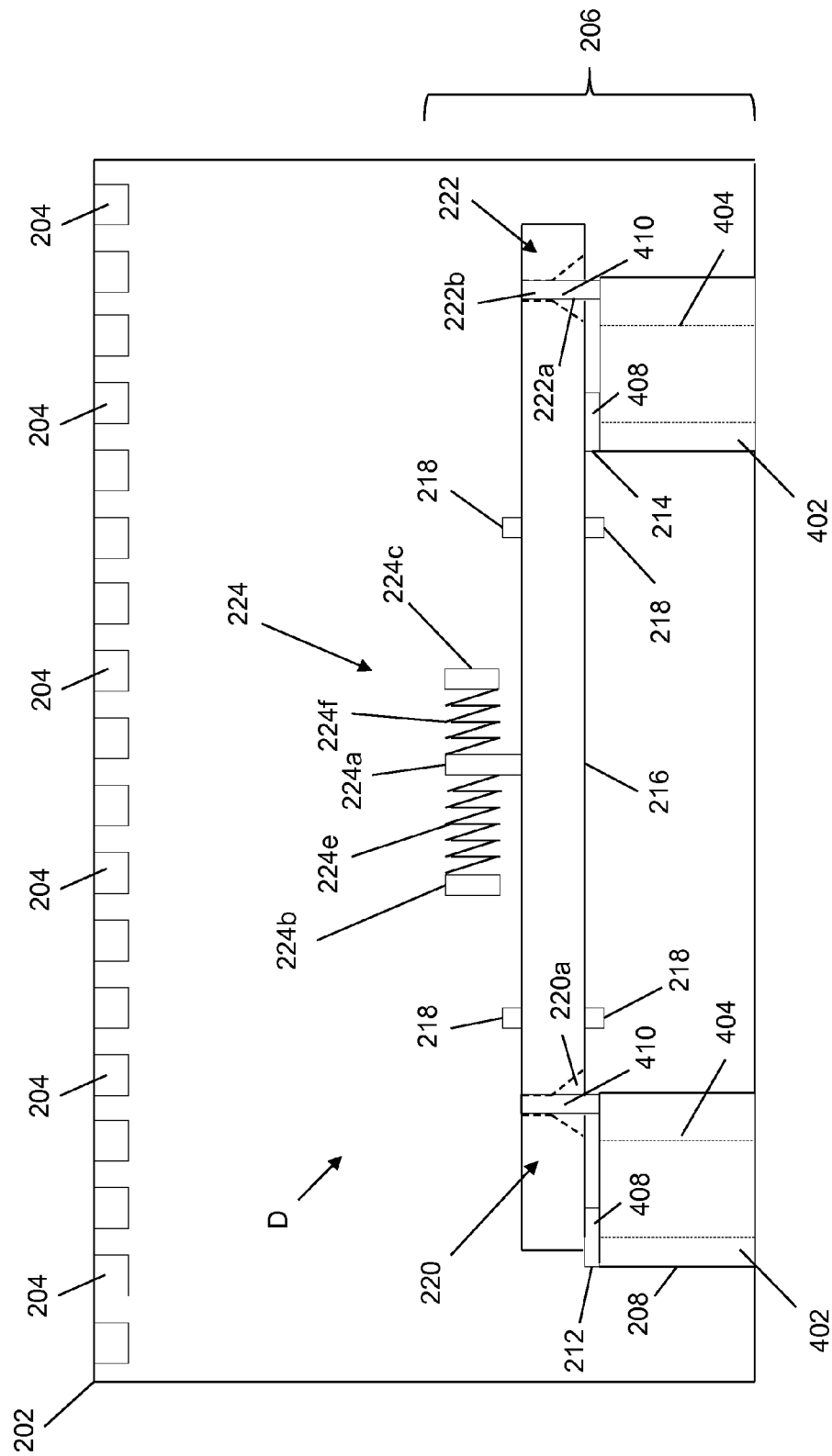
FIG. 6e is a schematic view illustrating an embodiment of a correctly keyed component coupled to the IHS component keying system of FIG. 2.

Referring now to FIGS. 6d and 6e, a second airflow direction type fan module (e.g., the fan module 400) may be easily positioned in the module slot 210 by positioning the keyed module 400 adjacent the slot entrance 210a of the module slot 210 such that the keyed member 410 and module connector 408 are positioned adjacent the slot entrance 210a, and then moving the keyed module 400 in the direction E such that the keyed module 400 enters the module slot housing 210b, as illustrated in FIG. 6d. As illustrated in FIG. 6e, continued movement of the keyed module 400 in the direction E will move the component chassis 402 through the module slot housing 210b of the module slot 210 until the keyed member 410 enters the pin channel 222b on the second keyed member 222. Fully positioning the keyed member 410 in the module slot 210 results in the mating of the module connector 408 on the keyed module 400 with the module connector 214 in the IHS chassis 202. Removal of both the keyed modules 400 from the module slots 208 and 210 allows the biasing system 224 to bias the keying device 216 back into the neutral orientation A from the first keyed orientation. One of skill in the art in possession of the present disclosure would recognize how the keying device 216 may be positioned in a second keyed orientation by first positioning the keyed module 300 in either of the module slots 208 or 210 such that only another keyed module 300 may be coupled to the IHS chassis 202 through the remaining open module slot 208 or 210. Similarly, one of skill in the art in possession of the present disclosure would recognize how the first keying member 220 and the second keying member 222 may be configured on the keying device 216 such that the positioning the keyed module 300 in either of the module slots 208 or 210 would restrict the other open module slot 208 or 210 to receiving the keyed module 400.

Thus, systems and methods have been described that allow the for the keying of a system for multiple modules by linking the keying of a first module slot to additional module slots such that the coupling of one of a plurality of different types of modules to the first module slot determines the types of modules that may be coupled to the additional module slots. The systems and methods described herein allow of the use of module slots that are compatible with multiple different types of modules, while also allowing for the restriction of what groupings of modules may be coupled to the system at the same time. While the embodiments discussed above include the restriction to groupings of the same types of modules for coupling to the system (in the context of different types of fan modules that provide airflow in different directions), one of skill in the art in possession of the present disclosure will recognize that a wide variety of different groupings of module types (the same module types, different module types, and/or combinations thereof) will benefit from the teachings of the present disclosure and thus fall within its scope.

Figure 7:
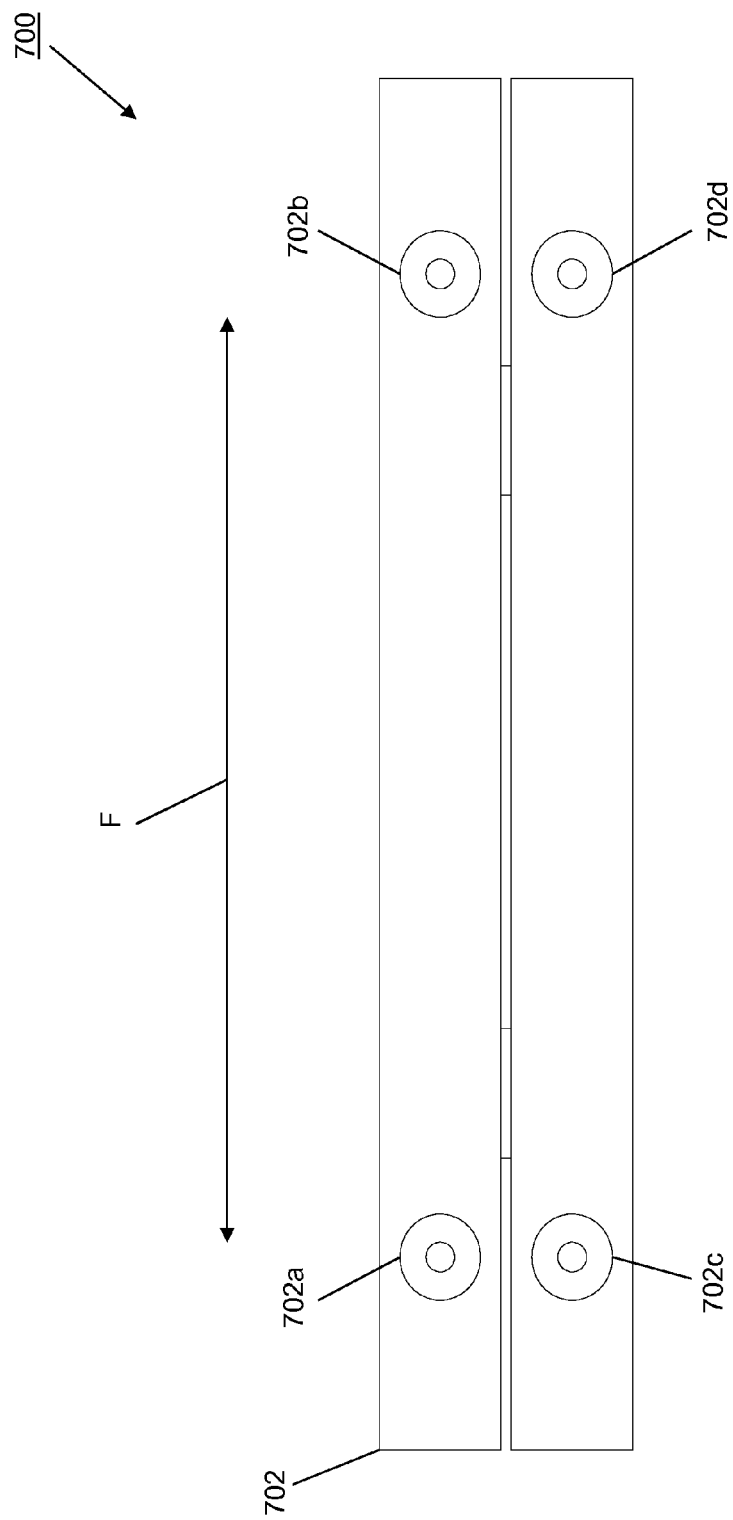
FIG. 7 is a schematic view illustrating an embodiment of a keying device.

Referring now to FIG. 7, an embodiment of a portion of a multi-module keying system 700 is illustrated that includes a keying device 702 that is configured to key more than two keyed modules. The keying device 702 includes a first keying member 702a, a second keying member 702b, a third keying member 702c, and a fourth keying member 702d. Each of the keying members 702*a-d* may include pin catching portions and pin channels similar to the keying members 220 and 222. One of skill in the art in possession of the present disclosure will recognize that the keying device 702 could be substituted in the multi-module keying system 200 discussed above by adding addition module slots underneath the module slots 208 and 210 (corresponding to the third keying member 702*c* and the fourth keying member 702*d*), and that the keying device 702 would move in a direction F in response to the positioning of a module in one of those module slots in order to key the other module slots.

Figure 8:
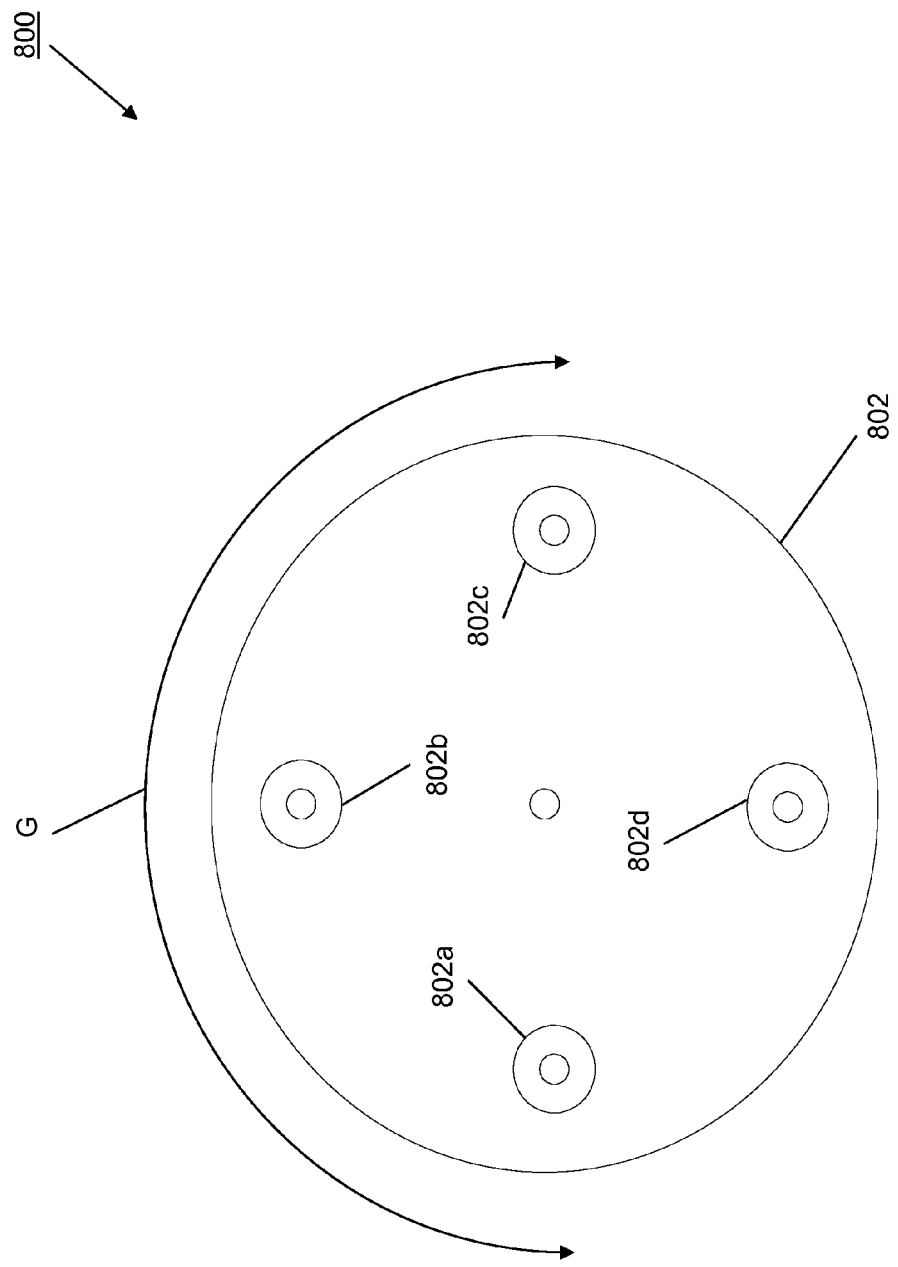
FIG. 8 is a schematic view illustrating an embodiment of a keying device.

Referring now to FIG. 8, an embodiment of a portion of a multi-module keying system 800 is illustrated that includes a circular keying device 802 that is configured to key more than two keyed modules. The keying device 802 includes a first keying member 802*a*, a second keying member 802*b*, a third keying member 802*c*, and a fourth keying member 802*d*. Each of the keying members 802*a-d* may include pin catching portions and pin channels similar to the keying members 220 and 222. One of skill in the art in possession of the present disclosure will recognize that the keying device 802 could be substituted in a multi-module keying system similar to the multi-module keying system 200 discussed above but having differently positioned module slots. In such a system, the positioning of a keyed module in one of those module slots would rotate the keying device 802 in a direction G in order to key the other module slots.

Figure 9:
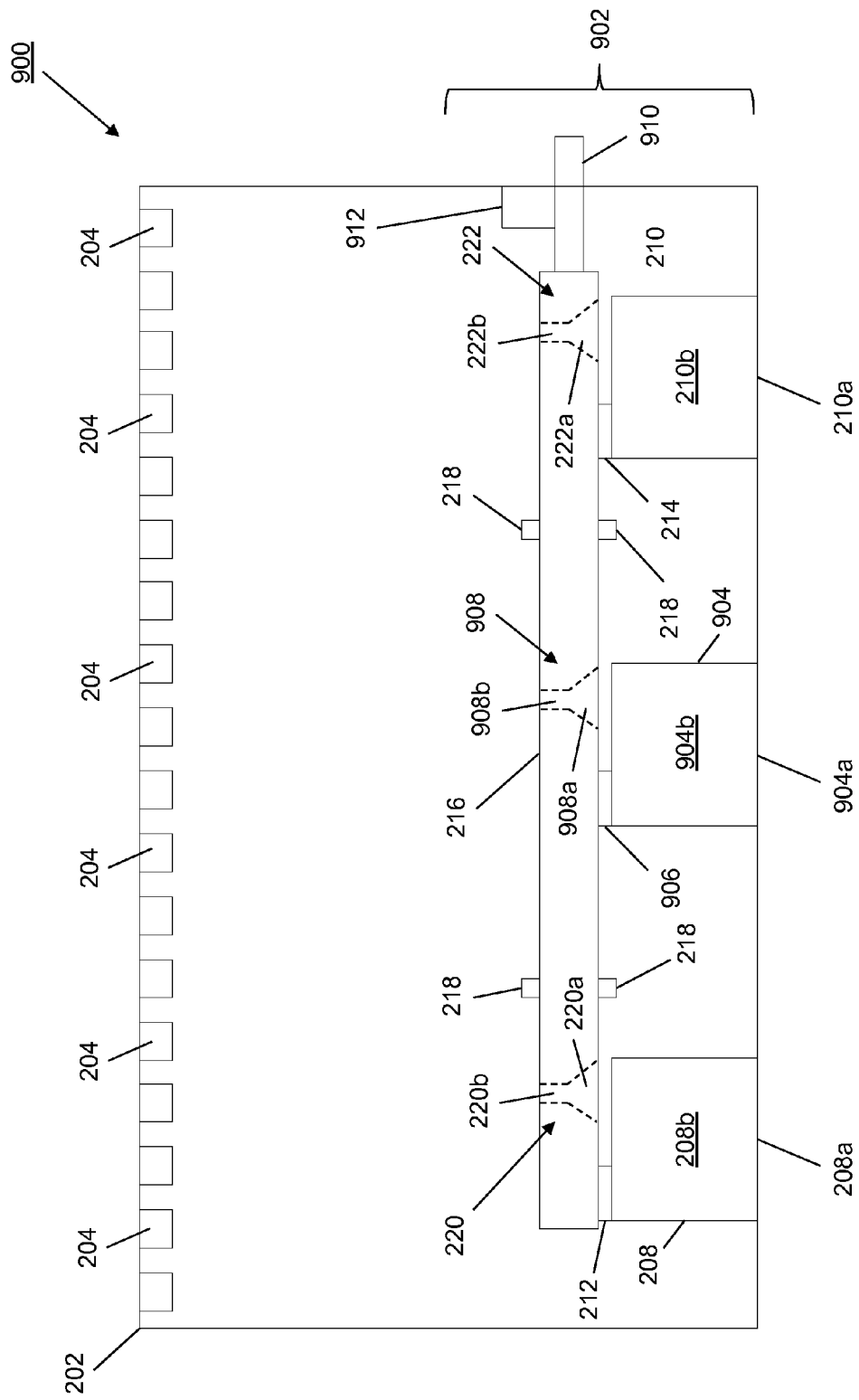
FIG. 9 is a schematic view illustrating an embodiment of an IHS component keying system.

Referring now to FIG. 9, an embodiment of a multi-module keying system 900 is illustrated that is substantially similar to the multi-module keying system 200, discussed above with reference to FIG. 2, but with a modified keying system 902. The modified keying system includes an additional module slot 904 having a slot entrance 904*a* to a module slot housing 904*b*. A module connector 906 is positioned at the rear of the module slot 904 and opposite the module slot housing 904*b* from the slot entrance 904*a*. A third keying member 908 is located on the keying device 216 between the first keying member 220 and the second keying member 222, and includes a pin catching portion 908*a* and a pin channel 908*b*. In place of the biasing system 224 of the multi-module keying system 200, a manual actuator 910 is coupled to the keying device 216 and to a locking system 912. In operation, a user may actuate the manual actuator 910 to move the keying device 216 on the guide members 218, and then lock the locking system 912 to prevent movement of the keying device 216 such that the keying system 902 is "set" and only a particular type of module or modules may be positioned in the module slots 208, 210 and 904 (e.g., according to the configuration of the first keying member 220, the second keying member 222, and the third keying member 908 on the keying device 216.) While the multi-module keying system 900 has been provided to illustrate a keying system that may be keyed for more than two modules and then manually set by a user, combinations of the multi-module keying system 900 with the embodiments discussed above (e.g., providing the biasing system 224 in the multi-module keying system 900) are envisioned as falling within the scope of the present disclosure.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A multi-module keying system, comprising:
a chassis;
a first fan module slot that is located on the chassis;
a second fan module slot that is located on the chassis; and
a keying device that is movably coupled to the chassis and that includes a first keying member that is located adjacent the first fan module slot and a second keying member that is located adjacent the second fan module slot, wherein the keying device moves in response to a first keyed fan module being positioned in the first fan module slot such that the first keyed fan module engages an interior of the first keying member, and wherein the movement of the keying device positions the second keying member adjacent the second fan module slot to restrict fan modules that may be positioned in the second fan module slot to only second keyed fan modules that are the same airflow direction type fan modules as the first keyed fan module.

2. The multi-module keying system of claim 1, further comprising:
a first fan module connector that is located in the first fan module slot and that mates with the first keyed fan module when the first keyed fan module is positioned in the first fan module slot; and
a second fan module connector that is located in the second fan module slot and that mates with a second keyed fan module when the second keyed fan module is positioned in the second fan module slot.

3. The multi-module keying system of claim 1, further comprising:
a biasing member coupled to the keying device to bias the keying device into a first position, wherein the movement of the keying device in response to the first keyed fan module being positioned in the first fan module slot such that the first keyed fan module engages the first keying member and moves the keying device to a second position that is different from the first position.

4. The multi-module keying system of claim 1, further comprising:
a third fan module slot that is located on the chassis, wherein the keying device includes a third keying member that is located adjacent the third fan module slot, and wherein the movement of the keying device positions the third keying member adjacent the third fan module slot to restrict fan modules that may be positioned in the third module slot to only third keyed fan modules.

5. The multi-module keying system of claim 4, wherein the first keyed fan module and the third keyed fan modules are different types of fan modules.

6. An information handling system (IHS), comprising:
an IHS chassis that houses a processing system and a memory system coupled to the processing system;
a first IHS fan component slot that is located on the IHS chassis;
a second IHS fan component slot that is located on the IHS chassis; and
a keying device that is movably coupled to the IHS chassis and that includes a first keying member that is located adjacent the first IHS fan component slot and a second keying member that is located adjacent the second IHS fan component slot, wherein the keying device moves in response to a first keyed IHS fan component being positioned in the first IHS fan component slot such that the first keyed IHS fan component engages an interior of the first keying member, and wherein the movement of the keying device positions the second keying member adjacent the second IHS fan component slot to restrict IHS fan components that may be positioned in the second IHS fan component slot to only second keyed IHS fan components that are the same airflow direction type IHS fan components as the first keyed IHS fan component.

7. The IHS of claim 6, further comprising:
a first IHS fan component connector that is located in the first IHS fan component slot and coupled to the processing system, wherein the first IHS fan component connector mates with the first keyed IHS fan component when the first keyed IHS fan component is positioned in the first IHS fan component slot; and
a second IHS fan component connector that is located in the second IHS fan component slot and coupled to the processing system, wherein the second IHS fan component connector mates with a second keyed IHS fan component when the second keyed IHS fan component is positioned in the second IHS fan component slot.

8. The IHS of claim 6, further comprising:
a biasing member coupled to the keying device to bias the keying device into a first position, wherein the movement of the keying device in response to the first keyed IHS fan component being positioned in the first IHS fan component slot such that the first keyed IHS fan component engages the first keying member and moves the keying device to a second position that is different from the first position.

9. The IHS of claim 6, further comprising:
a third IHS fan component slot that is located on the chassis, wherein the keying device includes a third keying member that is located adjacent the third IHS fan component slot, and wherein the movement of the keying device positions the third keying member adjacent the third IHS fan component slot to restrict IHS fan components that may be positioned in the third IHS component slot to only third keyed IHS fan components.

10. The IHS of claim 9, wherein the first keyed IHS fan component and the third keyed IHS fan components are different types of IHS fan components.

11. A method for coupling IHS components to an IHS chassis, comprising:
providing an IHS chassis including a first IHS fan component slot, a second IHS fan component slot, and a keying device having a first keying member positioned adjacent the first IHS fan component slot and a second keying member positioned adjacent the second IHS fan component slot;
positioning a first keyed IHS fan component in the first IHS fan component slot such that the first keyed IHS fan component engages an interior of the first keying member;
moving the keying device in response to the engagement of the first keyed IHS fan component and the first keying member such that the position of the second keying member relative to the second IHS fan component slot changes; and
restricting IHS fan components that may be positioned in the second IHS fan component slot to only second keyed IHS fan components that are the same airflow direction type IHS fan components as the first keyed IHS fan component based on the position of the second keying member relative to the second IHS fan component slot.

12. The method of claim 11, further comprising:
mating the first keyed IHS fan component with a first IHS fan component connector that is located in the first IHS fan component slot when the first keyed IHS fan component is positioned in the first IHS fan component slot; and
mating a second keyed IHS fan component with a second IHS fan component connector that is located in the second IHS fan component slot when the second keyed IHS fan component is positioned in the second IHS fan component slot.

13. The method of claim 11, further comprising:
biasing the keying device into a first position, wherein the movement of the keying device in response to the first keyed IHS fan component being positioned in the first IHS fan component slot such that the first keyed IHS fan component engages the first keying member moves the keying device to a second position that is different from the first position.

14. The method of claim 11, wherein the IHS chassis includes a third IHS fan component slot, and wherein the keying device includes a third keying member that is located adjacent the third IHS fan component slot, and wherein the movement of the keying device positions the third keying member adjacent the third IHS fan component slot to restrict IHS fan components that may be positioned in the third IHS fan component slot to only third keyed IHS fan components.

\* \* \* \* \*